(12) United States Patent
Gallhauser et al.

(10) Patent No.: US 10,419,135 B2
(45) Date of Patent: Sep. 17, 2019

(54) OVER THE AIR POWER SENSOR AND METHOD

(71) Applicant: Rohde & Schwarz GmbH & Co. KG, München (DE)

(72) Inventors: Markus Gallhauser, Freising (DE); Werner Perndl, Zorneding (DE); Nino Voss, München (DE); Georg Schnattinger, München (DE); Adam Tankielun, Ottobrunn (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 244 days.

(21) Appl. No.: 15/468,238

(22) Filed: Mar. 24, 2017

(65) Prior Publication Data
US 2018/0006736 A1      Jan. 4, 2018

(30) Foreign Application Priority Data

Jun. 29, 2016    (EP) .................................... 16176808

(51) Int. Cl.
*H04B 1/00*        (2006.01)
*H04B 17/10*       (2015.01)
(Continued)

(52) U.S. Cl.
CPC ....... *H04B 17/102* (2015.01); *G01R 29/0878* (2013.01); *H01Q 13/085* (2013.01);
(Continued)

(58) Field of Classification Search
CPC ...... H01Q 19/10; H04B 17/29; H04B 17/318; H01P 5/182; H02J 7/025; H02J 5/005
(Continued)

(56) References Cited

U.S. PATENT DOCUMENTS

| 6,414,645 B1 * | 7/2002 | Dahlberg ............... H01Q 1/283 343/705 |
| 2015/0035707 A1 | 2/2015 | Tankielun |
| 2017/0222736 A1 * | 8/2017 | Hechtfischer ........ H04B 17/103 |

FOREIGN PATENT DOCUMENTS

| CN | 103298020 A | 9/2013 |
| EP | 2 627 015 A2 | 8/2013 |

OTHER PUBLICATIONS

Extended European Search Report for European Application No. 16176808.0 (dated Dec. 13, 2016).
(Continued)

*Primary Examiner* — Tu X Nguyen
(74) *Attorney, Agent, or Firm* — Shumaker & Sieffert, P.A.

(57) ABSTRACT

The present invention provides an over the air, OTA, power sensor (1, 20, 50) for measuring power of a wireless signal (2, 21) with at least two different polarizations, the OTA power sensor (1, 20, 50) comprising a first power sensor (3, 4, 22, 23, 51, 52) for every polarization, every power sensor comprising a signal detector (5, 6, 25, 26, 27) for detecting the wireless signal (2, 21), wherein the signal detectors (5, 6, 25, 26, 27) are single polarized and wherein the polarization planes (7, 8, 28-30) of the signal detectors (5, 6, 25, 26, 27) are arranged at an angle of more than zero degree to each other and wherein the main radiation vectors (9, 10, 31-33) of the signal detectors (5, 6, 25, 26, 27) are parallel to each other, and the first power sensors (3, 4, 22, 23, 51, 52) each comprising a power measurement device (11, 12, 43-45), which is configured to measure the power of the detected wireless signal (2, 21) and output a respective measurement signal (13, 14, 46-48, 55-58). Further, the present patent application provides a respective method.

20 Claims, 4 Drawing Sheets

(51) Int. Cl.
  *H01Q 13/10*   (2006.01)
  *G01R 29/08*   (2006.01)
  *H01Q 13/08*   (2006.01)
  *H01Q 21/24*   (2006.01)
  *H01Q 25/00*   (2006.01)
  *H04B 7/0413*  (2017.01)

(52) U.S. Cl.
  CPC ........... *H01Q 13/106* (2013.01); *H01Q 21/24* (2013.01); *H01Q 25/001* (2013.01); *H04B 7/0413* (2013.01)

(58) Field of Classification Search
  USPC .................................................. 455/63.4, 25
  See application file for complete search history.

(56) References Cited

OTHER PUBLICATIONS

Response to Communication dated Jan. 8, 2018, from counterpart European Patent Application No. 16176808.0, filed on Mar. 26, 2018, 16 pp.
Commonly-assigned, co-pending U.S. Appl. No. 15/410,384 for "Test Device and Test Method," (Unpublised, filed Jan. 19, 2017).

\* cited by examiner

OVER THE AIR POWER SENSOR AND METHOD

PRIORITY CLAIM

This application claims the benefit of European Application No. 16176808.0, filed Jun. 29, 2016; the disclosure of which is incorporated herein by reference in its entirety.

TECHNICAL FIELD

The invention relates to an over the air, OTA, power sensor and a corresponding method for measuring power of a wireless signal with at least two different polarizations.

BACKGROUND

Although applicable to any system that requires measuring power of wireless signals, the present invention will be described in combination with devices under test, which are MIMO capable cell and follow the 802.11ad standard.

The frequencies used in radio communications and especially in applications like cell phone networks or wireless computer networks have continuously been increased into the GHz range. Using such high frequencies poses new challenges to the respective measurement equipment, which is used to evaluate and monitor such communication equipment.

One implication such high frequencies have is for example the fact that attaching a cable to the device under test will usually influence the behavior of the device under test regarding the radio frequency emissions. This means that the device under test has to be evaluated without physically attaching a cable to the device under test.

To allow evaluating these devices, in document US 2015/0 035 707 A1 a slot line antenna on a printed circuit board for receiving high frequency signals is disclosed.

There is a need for measuring high frequency signals with high accuracy and little hardware effort.

SUMMARY

The present invention solves this need with the over the air, OTA, power sensor with the features of claim 1 and a method with the features of claim 13.

A corresponding over the air, OTA, power sensor for measuring power of a wireless signal with at least two different polarizations comprises a first power sensor for every polarization, every power sensor comprising a signal detector for detecting the wireless signal. The signal detectors are single polarized and the polarization planes of the signal detectors are arranged at an angle of more than zero degree to each other and the main radiation vectors, i.e. the vectors which represent the main radiation/reception direction, of the signal detectors are parallel to each other. Further, the first power sensors each comprise a power measurement device, which is configured to measure the power of the detected wireless signal and output a respective measurement signal.

Further a method for over the air, OTA, measuring power of a wireless signal with at least two different polarizations comprises detecting the wireless signal with one single signal detector in a respective first power sensor for every polarization, wherein the polarization planes of the signal detectors are arranged at an angle of more than zero degree to each other and wherein the main radiation vectors of the signal detectors are parallel to each other. The method further comprises measuring the power of the detected wireless signal with one power measurement device in every first power sensor, and outputting respective measurement signals.

The present patent application is based on the finding that measuring high frequency signals contact-based is not an option, because the device under test will be influenced by the cabling.

Therefore, the present invention provides two power sensors, which each detect the wireless signal in one of at least two different polarizations and measure the power levels of the wireless signal in the respective polarization.

Further embodiments of the present invention are subject of the further subclaims and of the following description, referring to the drawings.

In a possible embodiment, the power measurement devices are provided as diode based power measurement devices. The diode based power measurement devices can e.g. comprise a simple arrangement of a diode in forward direction and a capacitor between the cathode and ground, which together form a rectifier and together transform the wireless signal into a measurement voltage. The power measurement devices can further comprise amplifier, analogue to digital converters, signal processors for power calculation and the like.

In a possible embodiment, the power sensors can each comprise a mixer, which is configured to down-convert the received wireless signal to respective frequency reduced measured signals, wherein the power measurement devices are configured to measure the power of the respective frequency reduced measured signal. The down-mixing or down-converting of the received wireless signal provides signals with a reduced frequency, which are much easier to analyze than the original high frequency signals. The mixer can e.g. be configured to down-mix or down-convert a received 802.11ad wireless signal from the GHz range to an intermediate frequency, IF, range in the kHz range.

In a possible embodiment, the signal detectors can comprise planar antennas, and the polarization planes of each of the planar antennas can correspond to the plane of the respective polarization. Such antennas can e.g. be so called Vivaldi antennas. Vivaldi antennas provide very little reflections in the direction of their main radiation vectors. In addition, Vivaldi antennas have broadband characteristics and are therefore suitable for ultra-wideband signals. They are further easy to manufacture using common methods for PCB production. Further, they can easily be impedance matched to the feeding line using microstrip line modelling methods.

In another possible embodiment, at least some surfaces, advantageously all surfaces of the power sensors facing in the main radiation direction, i.e. to the device under test, of the signal detectors can be adapted to absorb electromagnetic radiation and do not reflect electromagnetic radiation. Thereby, reflections towards the device under test are prevented. This increases the measuring accuracy.

In another possible embodiment, at least some surfaces, advantageously all surfaces of the power sensors facing in the main radiation direction of the signal detectors can be coated with a paint absorbing electromagnetic radiation and/or covered with absorber material absorbing electromagnetic radiation and/or fabricated from absorber material absorbing electromagnetic radiation. It is thereby possible to further reduce reflections towards the device under test thereby increasing the measuring accuracy.

In another possible embodiment, at least some surfaces, 50% of the surfaces, especially more than 70% or more than 90% of the surfaces, especially all surfaces, of the power sensors facing in the main radiation direction of the signal detectors are angled away from the main radiation vectors by at least 30°, preferably by at least 45°, most preferably by at least 60°. This further helps to reduce reflections towards the device under test, further increasing measuring accuracy.

In another possible embodiment, at least some surfaces, advantageously all surfaces of the power sensors facing in the main radiation direction of the signal detectors can be tapered towards the main radiation direction of the signal detectors. This reduces reflections towards the device under test, thereby increasing measuring accuracy. Further, this provides a small footprint of the OTA power sensor. This increases the flexibility of use.

In a possible embodiment, the OTA power sensor can comprise one first power sensor for a first polarization and one first power sensor for a second polarization, which is orthogonal to the first polarization, wherein the polarization planes of the first power sensors are each parallel to the respective polarization. With only two first power sensors, orthogonally polarized signals can be easily analyzed by providing the polarization planes of the sensors orthogonal to each other.

In a possible embodiment, the first power sensor for the first polarization and the first power sensor for the second polarization can be interlaced with each other such that they comprise the same main radiation vector. Especially Vivaldi antennas can be interlaced such that their respective main radiation vectors overlap each other and point in the same direction. This mechanical arrangement provides a very compact OTA power sensor.

In a possible embodiment, the OTA power sensor can comprise at least a second power sensor, which especially can be of the same type as the first power sensors, for the first polarization. The polarization plane of the signal detector of the second power sensor for the first polarization can be arranged in parallel to the first polarization, and the main radiation vectors of the first power sensor and the second power sensor for the first polarization can be parallel to each other. The sensors for the first polarization are therefore oriented in parallel in the same direction. This arrangement allows monitoring the power levels of the wireless signal at the borders of a measurement space, which is defined by the two sensors. Values of the power levels between the two power sensors can then easily be calculated.

In a possible embodiment, the first power sensor for the second polarization can be positioned between the first power sensor and the second power sensor for the first polarization. The polarization plane of the first power sensor for the second polarization can be parallel to, and especially can lay in, the plane defined by the main radiation vectors of the first power sensor and the second power sensor for the first polarization. Further, the main radiation vectors of the first power sensor and the second power sensor for the first polarization and the first power sensor for the second polarization can be parallel to each other. This means that all power sensors point in the same direction, i.e. their main radiation vectors point in the same direction. Further, the power sensors for the first polarization can e.g. be placed one on each side of the power sensor for the second polarization. This configuration can e.g. be called H-configuration.

In a possible embodiment, the OTA power sensor can comprise at least a second power sensor, which especially can be of the same type as the first power sensor, for the second polarization. The polarization plane of the signal detector of the second power sensor for the second polarization can be arranged in parallel to the second polarization. Further, the main radiation vectors of the first power sensor and the second power sensor for the second polarization can be parallel to each other. The power sensors for the first polarization can e.g. be arranged in the same fashion as the power sensors for the first polarization. If four power sensors are used—two for each polarization—they can be arranged in a square like fashion when looking onto the power sensors from the front, i.e. from the direction to which the main radiation vectors point at. This arrangement allows defining a two-dimensional monitoring space. Values of the power levels between the power sensors can then be calculated.

In a possible embodiment, the OTA power sensor can comprise a measurement signal processing unit, which is configured to combine at least two of the measurement signals and output a combined measurement signal. The combined measurement signal can e.g. be a combination of measurement signals of a first and a second power sensor. Such a combined measurement signal can e.g. provide information about the power levels in the abovementioned monitoring spaces. The term combination can be interpreted as any mathematical form of calculating a result based on the two input values. The combination can e.g. comprise an addition, a subtraction, a multiplication, a division or any combination thereof.

In a possible embodiment, the measurement signal processing unit can be configured to calculate and output a mean value of the measurement signals of the first power sensor and the second power sensor in one of the polarizations. Calculating the mean value allows providing an estimate power level at the position in the center between the two power sensors.

In a possible embodiment, the measurement signal processing unit can be configured to calculate and output a weighted mean value, wherein a weighting factor is predetermined for each one of the measurement signals. Using a weighted mean allows shifting the point in the monitoring space for which the estimate power level is calculated. The weighting factor can therefore depend on the shift of the point in the monitoring space with reference to the center of the monitoring space.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments, which are specified in the schematic figures of the drawings, in which.

In the figures like reference signs denote like elements unless stated otherwise.

DETAILED DESCRIPTION OF THE DRAWINGS

Figure 1:
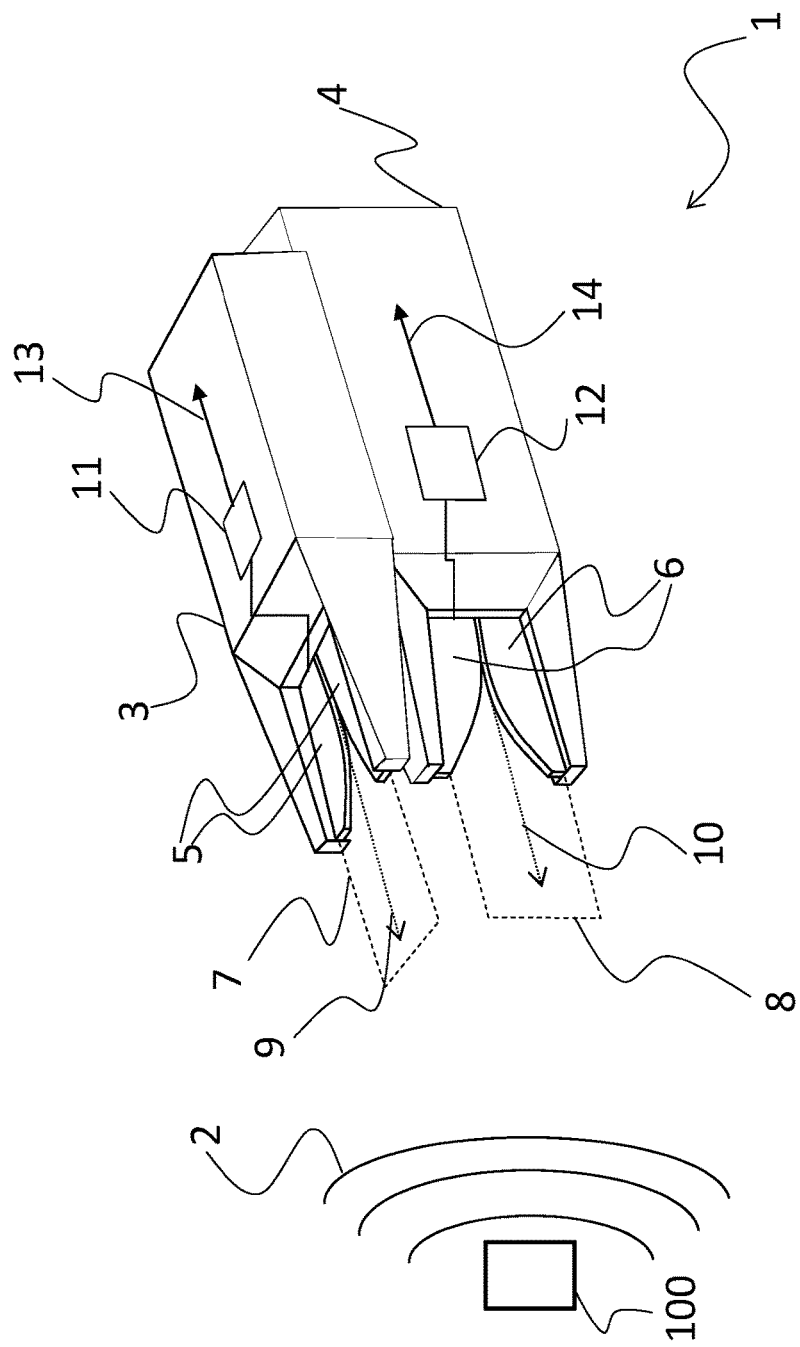
FIG. 1 shows a block diagram of an embodiment of an OTA power sensor according to the present invention.

FIG. 1 shows an OTA power sensor 1 with two first power sensors 3, 4. The wording first and second power sensors is only used to differentiate the sensors used in the same polarization. I.e. a first and a second power sensor are grouped together because they server to detect signals with the same polarization. For sake of simplicity in the following description, the terms "first" and "second" regarding the power sensors will be omitted. It will be clear from the figures and the respective description that the sensors with parallel polarization planes are a group of a first and a second power sensor.

The OTA power sensor 1 serves to detect wireless signal 2, which is emitted by the device under test 100, which is a 802.11ad conforming device.

The power sensors 3, 4 each comprise a respective signal detector 5, 6. The signal detectors in FIG. 1 are both provided in the form of Vivaldi antennas 5, 6. In FIG. 1 the polarization planes 7, 8 are shown for both Vivaldi Antennas 5, 6. The Vivaldi antennas 5, 6 and therefore the polarization planes 7, 8 of the Vivaldi antennas 5, 6 are orthogonal to each other, i.e. they are arranged in a 90° angle to each other. The main radiation vectors 9 and 8 are however parallel to each other. The term main radiation vector in this case refers to the direction of highest sensitivity of the Vivaldi antennas 5, 6.

Every power sensor 3, 4 comprises a power measurement device 11, 12, which is coupled to the respective Vivaldi antenna 5, 6 and measures the power of the wireless signal 2 as it is received by the respective Vivaldi antenna 5, 6. The Vivaldi antennas 5, 6 are coplanar antennas and the radiate and receive signals in the plane in which they extend, i.e. the respective polarization plane 7, 8.

The arrangement of FIG. 1 therefore allows measuring the power of the wireless signal 2 in the two polarization planes 7, 8, which are orthogonal to each other.

Figure 2:
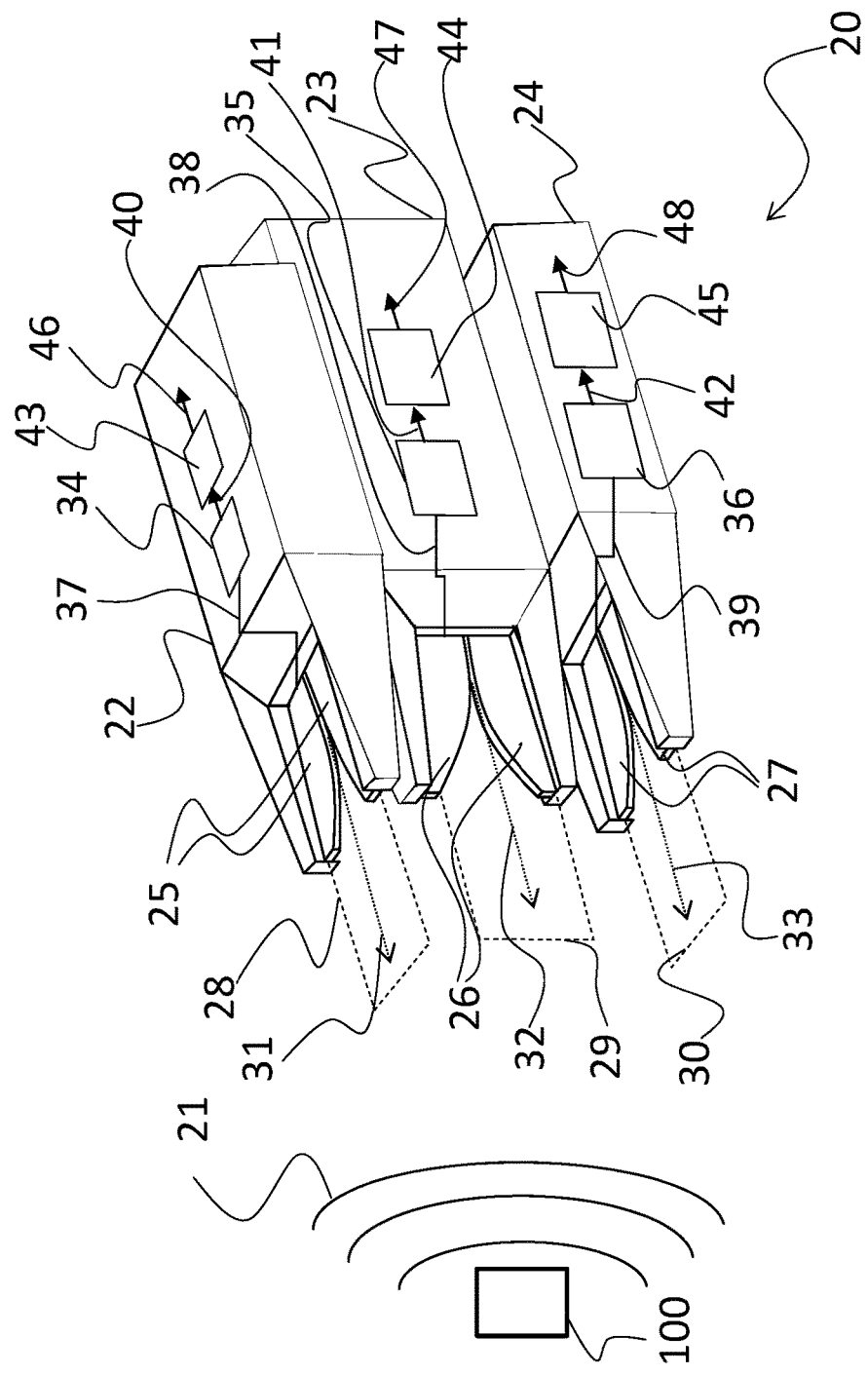
FIG. 2 shows a block diagram of another embodiment of an OTA power sensor according to the present invention.

FIG. 2 shows a block diagram of another OTA power sensor 20, which detects wireless signal 21, which is emitted by the device under test 101, which also is a 802.11ad conforming device. In contrast to the OTA power sensor 1 the OTA power sensor 20 comprises three power sensors 22, 23, 24. Further, the power sensors 22, 23, 24 each comprise a mixer 34, 35, 36, which down-converts the received wireless signal 37, 38, 39 to respective frequency reduced measured signals 40, 41, 42. The frequency reduced measured signals 40, 41, 42 are then provided to the power measurement devices 43, 44 45.

The power sensors 22 and 24 form a group of a first power sensor 22 and a second power sensor 24, which are both sensitive in the same first polarization. The polarization planes 28, 30 of the power sensors 22, 24 are parallel to each other, as well as the main radiation vectors 31, 33.

The power sensor 23 is arranged in the space between the power sensors 22, 24 and is provided orthogonal to the power sensors 22, 24. The power sensor 23 is therefore sensitive to another second polarization. Further, the polarization plane 29 is orthogonal to the polarization planes 28, 30, while the main radiation vector 32 is parallel to the main radiation vectors 31, 33. In fact, the main radiation vector 32 lies on the plane (not explicitly shown), which is defined by the two main radiation vectors 31, 33.

When looking onto the main radiation vectors 31, 32, 33, i.e. in a top-view, the arrangement will look like an H and can therefore be called H-form or H-arrangement.

The arrangement of FIG. 2 allows measuring the power of the wireless signal 21 e.g. with the power sensor 23 for the second polarization exactly in the main radiation direction of the antenna that emitted the wireless signal 21. Furthermore, in contrast to the arrangement of FIG. 1, by providing two power sensors 22, 24, the power of the wireless signal 21 for the first polarization can be measured at two positions.

It was already explained that the main radiation vector lies on the plane (not explicitly shown), which is defined by the two main radiation vectors 31, 33. This means that averaging the power levels measured by the two power sensors 31, 33 will provide a good estimate value for the power level at the main radiation vector but for the first polarization. It is understood, that calculating the average, i.e. the mean value, can also comprise calculating a weighted mean value.

The arrangement of FIG. 2 therefore allows measuring the exact power levels for two polarizations of the wireless signal 21 in the main radiation direction of the antenna that emits the wireless signal 21.

Although not explicitly shown, it is understood that the power sensor 31, 32, 33 can comprise or be connected to any device, which is needed to measure, calculate or otherwise determine the wanted power levels.

Figure 3:
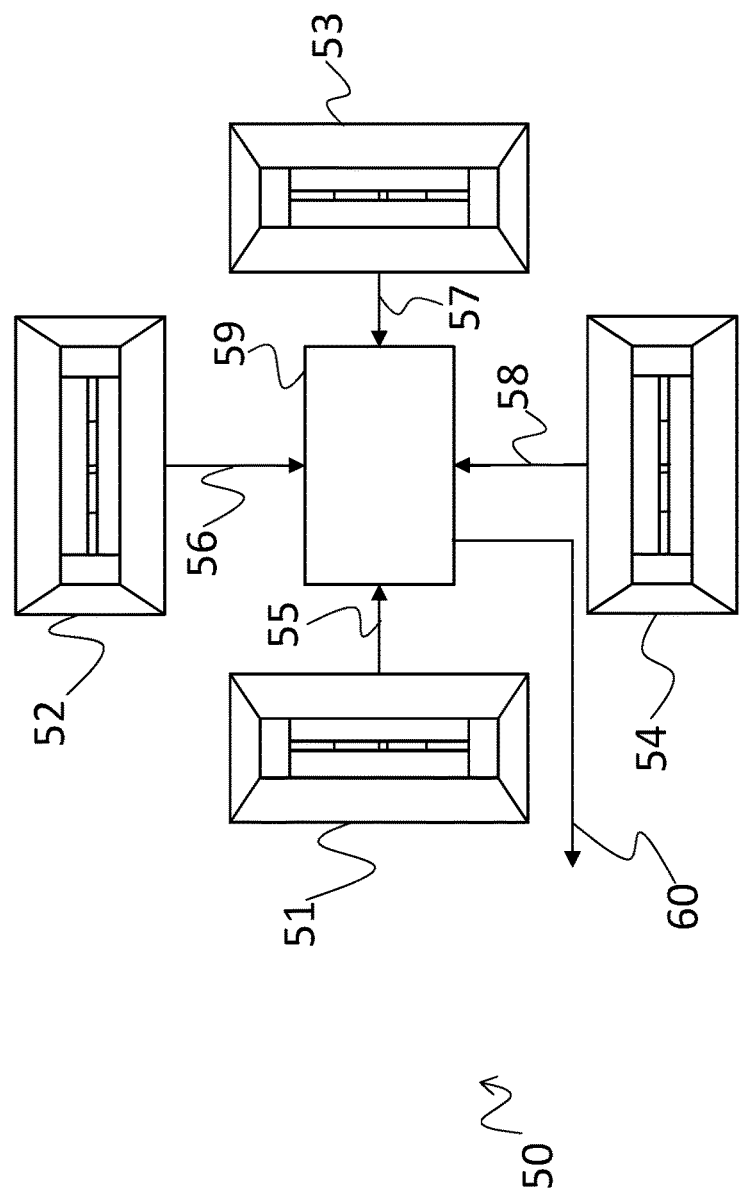
FIG. 3 shows a block diagram of another embodiment of an OTA power sensor according to the present invention.

FIG. 3 shows an OTA power sensor 50 in a top view, i.e. looking onto the main radiation vectors of the power sensors 51, 52, 53, 54.

As in FIG. 2 the power sensors 51, 53 form a group of a first power sensor 51 and a second power sensor 53 for a first polarization. In contrast to FIG. 2, the OTA power sensor 50 further comprises two power sensors 52, 54 for a second polarization, which is orthogonal to the first polarization.

The power sensors 51, 53 and the power sensors 52, 54 are arranged in a square shape. Therefore, the power sensors 51, 53 are arranged on opposite sides of the square shape, while the power sensors 52, 54 are also arranged on opposite sides of the square shape but orthogonally to the power sensors 51, 53.

As an example and just schematically a measurement signal processing unit 59 is provided in the center of the square arrangement of the power sensors 51, 52, 53, 54. The measurement signal processing unit 59 receives the single measurement signals 55, 56, 57, 58 and calculates for every polarization a mean value. The calculated results are then provided as weighted mean values 60 for further processing.

The arrangement of FIG. 3 provides more flexibility than the arrangement of FIG. 2, because by using weighted mean values, the point for which the weighted mean value 60 is calculated can be varied within the area of the square defined by the power sensors 51, 52, 53, 54.

The weighting factors for every polarization can e.g. be provided as values between 0 and 1, wherein the sum of the respective two weighting factors must equal 1.

If the power for the center point is to be calculated the mean power can e.g. be provided with a constant factor of 0.5 by the formula:

$$P=0.5a+0.5b$$

Wherein P is the mean power value, a is the measured power level of the first power sensor and b is the measured power level of the second power sensor.

Shifting the point, for which the mean value is calculated, can be performed, by modifying the factor of 0.5 according to the above rules, e.g.:

$$P=0.7a+0.3b$$

Figure 4:
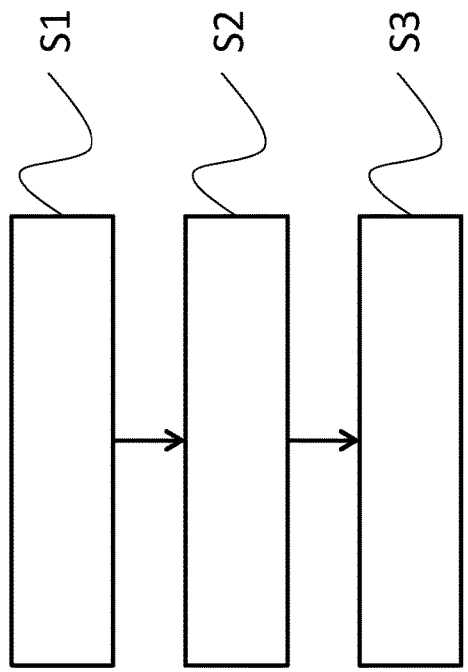
FIG. 4 shows a flow diagram of an embodiment of a method according to the present invention.

FIG. 4 shows a flow diagram of a method for over the air, OTA, measuring power of a wireless signal 2, 20 with at least two different polarizations.

In a first step S1 the wireless signal 2, 20 is detected with one single signal detector 5, 6, 25, 26, 27 in a respective first power sensor 3, 4, 22, 23, 51, 52 for every polarization.

As already explained above the polarization planes 7, 8, 28-30 of the signal detectors 5, 6, 25, 26, 27 are arranged at an angle of more than zero degree to each other and the main radiation vectors 9, 10, 31-33 of the signal detectors 5, 6, 25, 26, 27 are parallel to each other.

In step S2 the power of the detected wireless signal 2, 20 is measured with one power measurement device 11, 12, 43-45 in every one of the first power sensors 3, 4, 22, 23, 51, 52.

Finally, respective measurement signals 13, 14, 46-48, 55-58 are output e.g. for further processing of the measurement results.

As it is challenging to work with high frequency signals, the received wireless signal 37, 38, 39 can be down-converted to respective frequency reduced measured signals 40, 41, 42.

The step S2 of measuring is then applied to the respective frequency reduced measured signals 40, 41, 42.

To provide a complete analysis of the wireless signal 2, the wireless signal 2, 21 can be detected with two orthogonal polarizations, wherein the respective first power sensors 3, 4, 22, 23, 51, 52 are provided such that the polarization planes 7, 8, 28-30 of their signal detectors 5, 6, 25, 26, 27 are orthogonal to each other.

As already explained above the measurement signals 13, 14, 46-48, 55-58 can be combined and a respective combined measurement signal 60 can be provided. Combining can e.g. comprise calculating and outputting a mean value, e.g. a weighted mean value, of the measurement signals 13, 14, 46-48, 55-58 of the first power sensor 3, 4, 22, 23, 51, 52 and the second power sensor 24, 53, 54 in one of the polarizations.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

LIST OF REFERENCE SIGNS 1, 20, 50 over the air power sensor
2, 21 wireless signal
3, 4, 22, 23, 51, 52 first power sensor
5, 6, 25-27 signal detector
7, 8, 28-30 polarization planes
9, 10, 31-33 main radiation vectors
11, 12, 43-45 power measurement device
13, 14, 46-48, 55-58 measurement signal
34-36 mixer
37-39 received wireless signal
40-42 frequency reduced measured signals
24, 53, 54 second power sensor
59 measurement signal processing unit
60 weighted mean value
100, 101 device under test
S1-S3 method steps

The invention claimed is:

1. An over the air, OTA, power sensor for measuring power of a wireless signal with at least two different polarizations, the OTA sensor comprising:
   a first power sensor for every polarization, every power sensor comprising a signal detector for detecting the wireless signal, wherein the signal detectors are single polarized and wherein the polarization planes of the signal detectors are arranged at an angle of more than zero degree to each other and wherein the main radiation vectors of the signal detectors are parallel to each other,
   the first power sensors each comprising a power measurement device, which is configured to measure the power of the detected wireless signal and output a respective measurement signal; and
   a measurement signal processing unit, configured to combine at least two of the measurement signals and output a combined measurement signal,
   wherein the measurement signal processing unit is configured to calculate and output a mean value of the measurement signals of the first power sensor and the second power sensor in one of the polarizations.

2. The OTA power sensor according to claim 1, wherein the power measurement devices are provided as diode based power measurement devices.

3. The OTA power sensor according to claim 1, the power sensors each comprising a mixer, which is configured to down-convert the received wireless signal to respective frequency reduced measured signals, wherein the power measurement devices are configured to measure the power of the respective frequency reduced measured signal.

4. The OTA power sensor according to claim 1, wherein the signal detectors comprise planar antennas, and wherein the polarization planes of each of the planar antennas corresponds to the plane of the respective polarization.

5. The OTA power sensor according to claim 1, comprising one first power sensor for a first polarization and one first power sensor for a second polarization, which is orthogonal to the first polarization, wherein the polarization planes of the first power sensors are each parallel to the respective polarization.

6. The OTA power sensor according to claim 5, wherein the first power sensor for the first polarization and the first power sensor for the second polarization are interlaced with each other such that they comprise the same main radiation vector.

7. The OTA power sensor according to claim 5, comprising at least a second power sensor for the first polarization,
wherein the polarization plane of the signal detector of the second power sensor for the first polarization is arranged in parallel to the first polarization, and
wherein the main radiation vectors of the first power sensor and the second power sensor for the first polarization are parallel to each other.

8. The OTA power sensor according to claim 7, wherein the first power sensor for the second polarization is positioned between the first power sensor and the second power sensor for the first polarization, and
wherein the polarization plane of the first power sensor for the second polarization is parallel to the plane defined by the main radiation vectors of the first power sensor and the second power sensor for the first polarization, and
especially wherein the main radiation vectors of the first power sensor and the second power sensor for the first polarization and the first power sensor for the second polarization are parallel to each other.

9. The OTA power sensor according to claim 8, comprising at least a second power sensor for the second polarization,
wherein the polarization plane of the signal detector of the second power sensor for the second polarization is arranged in parallel to the second polarization, and
wherein the main radiation vectors of the first power sensor and the second power sensor for the second polarization are parallel to each other.

10. The OTA power sensor according to claim 1, wherein the measurement signal processing unit is configured to calculate and output a weighted mean value, and wherein a weighting factor is predetermined for each one of the measurement signals.

11. A method for over the air, OTA, measuring power of a wireless signal with at least two different polarizations, the method comprising:
detecting the wireless signal with one single polarized power sensor in a respective first power sensor for every polarization, wherein the polarization planes of the signal detectors are arranged at an angle of more than zero degree to each other and wherein the main radiation vectors of the signal detectors are parallel to each other,
measuring the power of the detected wireless signal with one power measurement device in every first power sensors, and
combining at least two of the measurement signals and outputting a combined measurement signal, wherein combining comprises calculating and outputting a mean value of the measurement signals of the first power sensor and the second power sensor in one of the polarizations.

12. The method according to claim 11, comprising providing the power measurement devices as diode based power measurement devices.

13. The method according to claim 11, further comprising down-converting the received wireless signal to respective frequency reduced measured signals, wherein measuring comprises measuring the power of the respective frequency reduced measured signal.

14. The method according to claim 11, wherein the signal detectors are provided with planar antennas, and wherein the polarization planes of each of the planar antennas corresponds to the plane of the respective polarization.

15. The method according to claim 11, comprising detecting the wireless signal with two orthogonal polarizations, wherein the respective first power sensors are provided such that the polarization planes of their signal detectors are orthogonal to each other.

16. The method according to claim 15, wherein the first power sensor for the first polarization and the first power sensor for the second polarization are interlaced with each other such that they comprise the same main radiation vector.

17. The method The method according to claim 15, comprising providing at least a second power sensor for the first polarization,
wherein the polarization plane of the signal detector of the second power sensor for the first polarization is arranged in parallel to the first polarization, and
wherein the main radiation vectors of the first power sensor and the second power sensor for the first polarization are parallel to each other.

18. The method according to claim 17, comprising positioning the first power sensor for the second polarization between the first power sensor and the second power sensor for the first polarization,
wherein the polarization plane of the first power sensor for the second polarization is parallel to the plane defined by the main radiation vectors of the first power sensor and the second power sensor for the first polarization, and
especially wherein the main radiation vectors of the first power sensor and the second power sensor for the first polarization and the first power sensor for the second polarization are parallel to each other.

19. The method The method according to claim 17, comprising providing at least a second power sensor for the second polarization,
wherein the polarization plane of the signal detector of the second power sensor for the second polarization is arranged in parallel to the second polarization, and
wherein the main radiation vectors of the first power sensor and the second power sensor for the second polarization are parallel to each other.

20. The method according to claim 17, wherein calculating the mean value comprises calculating a weighted mean value, wherein a weighting factor is predetermined for each one of the measurement signals.

* * * * *